United States Patent [19]

Kikuchi et al.

[11] Patent Number: 5,122,860
[45] Date of Patent: Jun. 16, 1992

[54] INTEGRATED CIRCUIT DEVICE AND MANUFACTURING METHOD THEREOF

[75] Inventors: Tatsuro Kikuchi; Yoshitsugu Uenishi, booth of Hirakata, Japan

[73] Assignee: Matsushita Electric Industrial Co., Ltd., Osaka, Japan

[21] Appl. No.: 586,392

[22] PCT Filed: Aug. 25, 1988

[86] PCT No.: PCT/JP88/00842

§ 371 Date: Apr. 17, 1989

§ 102(e) Date: Apr. 17, 1989

[87] PCT Pub. No.: WO89/01873

PCT Pub. Date: Mar. 9, 1989

Related U.S. Application Data

[63] Continuation of Ser. No. 343,266, Apr. 17, 1989, abandoned.

[30] Foreign Application Priority Data

Aug. 26, 1987 [JP] Japan .................. 62-212085
Feb. 19, 1988 [JP] Japan .................. 63-38081

[51] Int. Cl.⁵ .................. H01L 23/28; H01L 23/02; H01L 23/12
[52] U.S. Cl. .................. 357/72; 357/74
[58] Field of Search .................. 357/74, 70, 72

[56] References Cited

U.S. PATENT DOCUMENTS

4,532,419  7/1985  Takeda .................. 235/492

FOREIGN PATENT DOCUMENTS

| 51-16701 | 5/1976 | Japan . | |
| 58-11198 | 1/1983 | Japan . | |
| 61-222714 | 10/1983 | Japan . | |
| 59-228743 | 11/1984 | Japan | 357/74 |
| 60-15786 | 1/1985 | Japan . | |
| 60-68488 | 4/1985 | Japan | 357/74 |
| 60-183745 | 9/1985 | Japan | 357/72 |
| 61-222715 | 10/1986 | Japan | 357/74 |
| 62-134944 | 6/1987 | Japan | 357/74 |
| 62-154769 | 7/1987 | Japan | 357/74 |

*Primary Examiner*—Andrew J. James
*Assistant Examiner*—D. Monin
*Attorney, Agent, or Firm*—Stevens, Davis, Miller & Mosher

[57] ABSTRACT

Provided is an integrated circuit device is used in an IC card or the like, and a manufacturing method of the integrated circuit device, having a thin thickness so as to be capable of being manufactured highly accurately in dimensions and highly efficiently. The integrated circuit element (12) is mounted on one surface of the thin metal plates (11) having the other surface which at least part serves as a plurality of external connecting terminals (11a) and, on one surface side, the integrated circuit element (12) is covererd with a sealing resin (15).

4 Claims, 6 Drawing Sheets

5,122,860

INTEGRATED CIRCUIT DEVICE AND MANUFACTURING METHOD THEREOF

This application is a continuation of application Ser. No. 343,266, filed Apr. 17, 1989 now abandoned.

TECHNICAL FIELD

The present invention relates to an integrated circuit device for use in, for example, an IC card or the like, and a manufacturing method of the integrated circuit device.

BACKGROUND ART

In recent years, so-called IC cards, in which an integrated circuit element such as a microcomputer, a memory or the like is installed on or incorporated in a plastic card, have been offered for actual use.

Since these IC cards are large in storage capacity and are excellent in crime prevention ability as compared with magnetic stripe cards which have already been in daily use, it has been considered that IC cards can be employed not only in place of conventional magnetic stripe cards, but also for various usages such as identification cards and so on.

By the way, the IC card is arranged such that an integrated circuit device having terminals for connection to an external device such as a reader/writer is mounted in a card made of plastics such as polyvinyl chloride or the like. The integrated circuit device is required to be formed as thin as possible.

There are many types of IC cards but it has been considered in the ISO (International Standardization Organization) that the IC cards should be standardized to a size identical with the conventional magnetic stripe card.

The conventional IC card and an integrated circuit device used in the card will be described below with reference to the accompanying drawings.

FIG. 10 is a perspective view of the IC card, FIG. 11 is a cross-sectional view taken along the line A—A' in FIG. 10, showing the periphery of the integrated circuit device, and FIG. 12 is a longitudinal cross-sectional view of the integrated circuit device which employs the conventional circuit board.

Conventionally, many methods have been carried into effect for a manufacturing method and an arrangement of IC cards. For example, as shown in FIGS. 10 and 11, a well 2 corresponding in size to an integrated circuit device 30 is formed in a thin plastic card 1 in the form of a sheet having a thickness on the order of 760 $\mu$m, by the use of an end mill, a Thomson mold or the like. The integrated circuit device 30 having a thickness slightly smaller than the plastic card 1 is inserted in the well 2, and is fixedly bonded to the bore 2 with external connecting terminals 32 being exposed.

The conventional integrated circuit device 30 has been arranged as illustrated in FIG. 12, and as disclosed in U.S. Pat. No. 4,264,917. Circuit conductors such as an external connecting terminal pattern 32, a circuit pattern 33, through-holes 34 and so on are formed on or in an insulating substrate 31 in the form of a film, thereby forming a thin-type circuit board 31A. Each integrated circuit element 35 is die-bonded to the thin-type circuit board 31A, and input/output electrodes of the integrated circuit element 35 and the circuit pattern 33 are connected to each other through metal wires 36 by a wire-bonding system or the like. Further, a sealing frame 37 for stopping flow of resin at resin sealing is provided so as to be bonded to the thin-type circuit board 31A. The integrated circuit elements 35 are sealed by a sealing material 38 such as epoxy resin or the like, to form the integrated circuit device 30.

By the way, the integrated circuit device 30 installed on an IC card has been required to have high reliability and high precision in dimensions and to be low in cost, simultaneously with being thin. In the aforesaid integrated circuit device 30, however, the thin-type circuit board 31A has the following problems in use, because the thin-type circuit board 31A is a two-sided circuit board with through-holes, in which the circuit conductors are formed on both sides of the insulating substrate 31 and are connected to each other through the through-holes 34.

Since the IC cards are required to have a thickness of 760±80 $\mu$m similar to conventional magnetic stripe cards, the thickness of the integrated circuit device 30 to be embedded is restricted by a large degree. For example, in case of an IC card arranged such that the integrated circuit device 30 is embedded in the plastic card 1 as shown in FIG. 11, the integrated circuit device 30 embedded in the well 2 is required to be restricted to a thickness of 650±30 $\mu$m, should the thickness of the remaining portion Ⓐ of the bottom of the well 2 in the plastic card 1 be, for example, 110±50 $\mu$m including adhesive. As the basic dimensions determining the thickness of the integrated circuit device 30, the dimension Ⓑ of the thin-type circuit board 31A including the sealing frame 37 illustrated in FIG. 12 becomes very important. Therefore it is necessary for manufacture of the thin-type circuit board 31A such that the dimension Ⓑ is brought to a value within a certain dimension range, for example, a value within a range of 650±30 $\mu$m. However, it is extremely difficult to manufacture such highly accurate and precise thin-type circuit board 31A, resulting in the thin-type circuit board 31A which is high in cost. As a result, for the integrated circuit device 30 having installed thereon the thin-type circuit board 31A it is also difficult to obtain highly accurate thickness dimension, causing a high cost.

DISCLOSURE OF THE INVENTION

The invention has been done in view of the problems discussed above, and has as its object to provide a thin-type integrated circuit device suitable for an IC card, which can be manufactured highly accurately in dimensions and highly efficiently, and which is low in cost.

In order to solve the above-mentioned problems, an integrated circuit device according to the invention comprises thin metal plates having one surface at least a part of which is formed therein with a plurality of external connecting terminals, and the other surface on which an integrated circuit element is mounted wherein input/output electrodes of said integrated circuit element and the other surface of said thin metal plates are electrically connected to each other, and wherein, on the other surface side of said thin metal plates, at least said integrated circuit element and the electric connections between the integrated circuit element and the other side of the thin metal plates are covered with a sealing resin.

With the arrangement of the invention described above, since the expensive precise circuit board, which has conventionally been used, is dispensed with, and instead, the thin metal plates can be employed which are formed into inexpensive and widely usable lead frame configurations, the cost of the integrated circuit device is reduced, and the integrated circuit device can be manufactured highly precisely in dimensions and highly efficiently as a thin-type integrated circuit device suitable for an IC card.

BEST MODE FOR CARRYING OUT THE INVENTION

An integrated circuit device according to embodiments of the invention will be described below with reference to the drawings.

Figure 1:
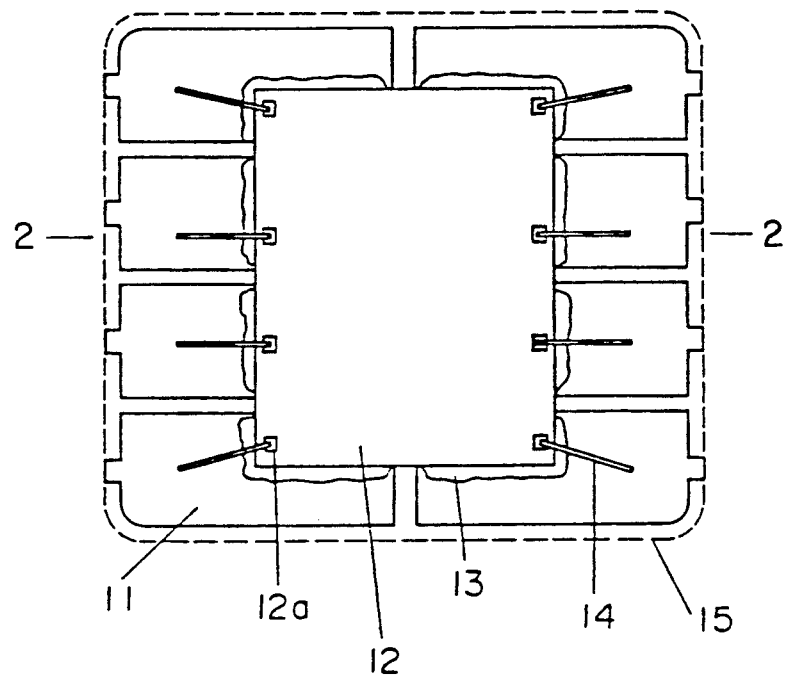
FIG. 1 is a plan view of an integrated device according to a first embodiment of the invention.
Figure 2:
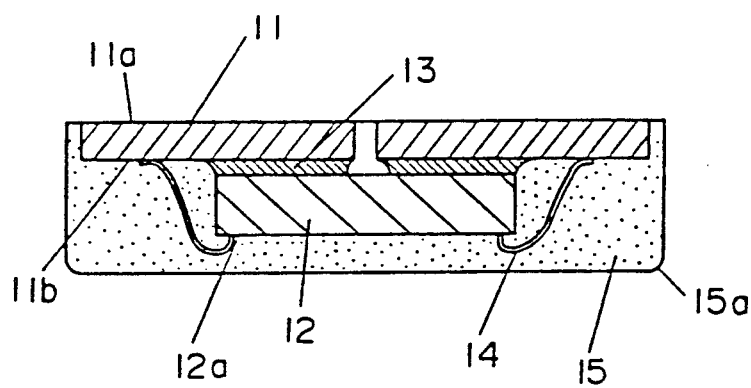
FIG. 2 is a longitudinal cross-sectional view of the integrated circuit device according to the first embodiment of the invention.

FIG. 1 is a plan view of an integrated circuit device according to a first embodiment of the invention, showing sealing resin whose only outer configuration is indicated by the broken line for the purpose of explanation. FIG. 2 is a longitudinal cross-sectional view of the integrated circuit device according to the first embodiment of the invention, the longitudinal cross-section being taken along the line B—B' in FIG. 1. In FIGS. 1 and 2, reference numeral 11 denotes thin metal plates, 12 an integrated circuit element, 13 adhesive, 14 metal wires, and 15 sealing resin.

An arrangement of the integrated circuit device according to the embodiment as well as a manufacturing method thereof will be described below in detail.

First, a metal blank consisting of a stripping like copper alloy having thickness of 0.15 mm is subject to a punching or a photo-etching process, so as to be formed in a desirable lead frame configuration. One of the surfaces of each lead frame configuration is formed therein with an external connecting terminals 11a. The external connecting terminals 11a serve as external connecting terminals in an integrated circuit device for an IC card. One of the surfaces of each lead frame configuration was subject to a nickel underplating process and a gold plating process. The other surface was subject to a nickel under-plating and, subsequently, only a connecting portion was subject partially to a silver-plating process in order to connect metal wires 14 to the other surface. Through these treatments described above, the metal plates 11 were formed. In this connection, as the strip-like metal blank for the lead frame, various kinds of metal blanks can be used such as iron, iron-nickel alloy or the like in addition to copper alloy. The external connecting terminal surfaces may be subject to plating with noble metal such as platinum, rhodium or the like capable of ensuring their reliability as contact terminals, in addition to gold.

Subsequently, the integrated circuit element 12 was fixedly bonded to the other surface 11b of the thin metal plates 11 by use of the adhesive 13 consisting of insulating resin. The reason why the insulating resin is employed as the adhesive 13 is to prevent electric short-circuiting at the time when the integrated circuit element 12 is mounted so as to straddle a plurality of thin metal plates 11 as illustrated in FIGS. 1 and 2 because the integrated circuit element 12 is large in size in comparison with the positions and dimensions of the external connecting terminals. By use of the adhesive 13 consisting of insulating resin, both restriction on the dimension of the integrated circuit element 12 to be mounted and restriction on the positions and dimensions of the thin metal plates 11 are relieved considerably.

Subsequently, fine gold wires of 25 μm in diameter were used as the metal wires 14, to electrically connect the input/output electrodes 12a of the integrated circuit element 12 and the other sides 11b of the tin metal plates 11 to each other by a wire bonding method. This electric connection may be effected also by a wireless bonding method such as a flip-chip system, a film-carrier system or the like, in addition to the connection with the metal wires.

After the necessary electric connection between the input/output electrodes 12a of the integrated circuit element 12 and the thin metal plates 11 is completed, a sealing molding material such as epoxy resin was used and was molded by a transfer molding method, to cover the integrated circuit element 12 and the metal wires 14 with the sealing resin 15 which therefore protects the integrated circuit element 12 and the metal wires 14. Subsequently, unnecessary portions (not shown) of the lead frames were cut and removed. Thus, the integrated circuit device according to the present embodiment illustrated in FIGS. 1 and 2 was obtained.

Figure 3:
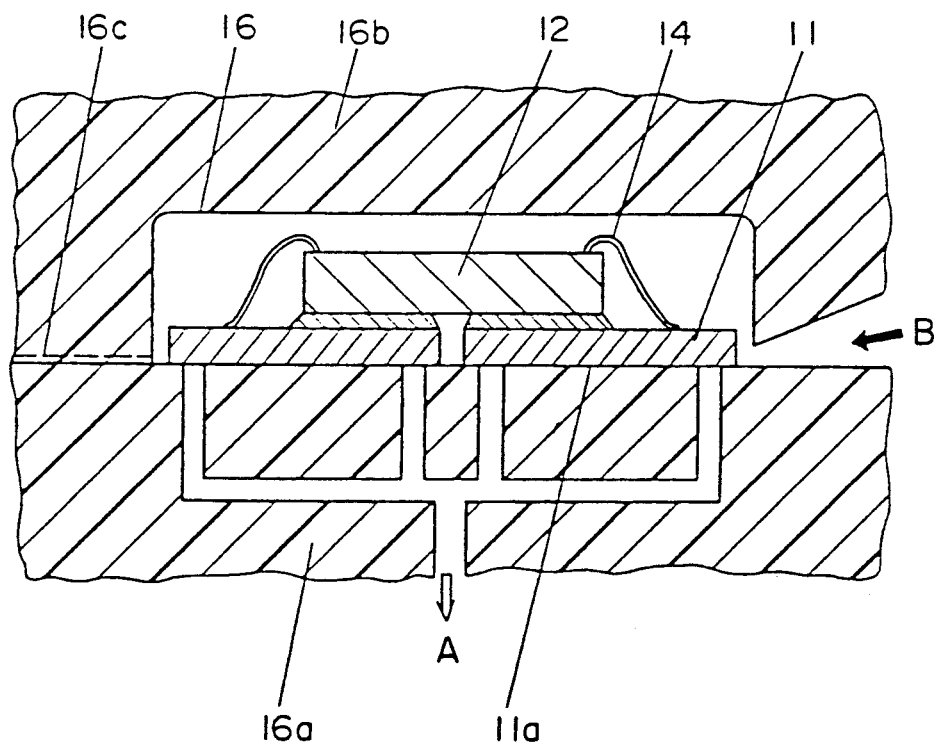
FIG. 3 is a longitudinal cross-sectional view for explanation of a method of manufacturing the integrated circuit device according to the first embodiment of the invention.

The molding method of the aforesaid sealing resin 15 will be described is more detail with reference to FIG. 3. The thin metal plates 11 of the lead frame configurations, on which the integrated circuit element 12 was mounted and fixedly bonded and to which the necessary connection was made through the metal wires 14, was set in a lower mold half 16a of a forming mold 16 heated to a molding temperature for transfer molding, with the external connecting terminal surfaces 11a being in close contact with the lower mold half 16a. Subsequently, after the lower mold half 16a and an upper mold half 16b had been closed, a sealing molding material consisting of epoxy resin as a main component, and hardener, filler and other additives was poured, under heating and pressurizing, into the mold 16 from a direction indicated by the arrow B, and washed for a predetermined period of time for curing. Subsequently, the sealing molding material was taken out of the transfer mold 16, and unnecessary portions of the lead frame configurations were cut and removed. Thus, the integrated circuit device illustrated in FIG. 1 was obtained. The reason why the external connecting terminal surfaces 11a are in close contact with the lower mold half 16a of the forming mold 16 of transfer molding is to prevent the sealing resin from flowing to the external connecting terminal surfaces 11a. In order to achieve close contact between the external connecting terminal surfaces 11 and the lower mold half, the external connecting external surfaces were abutted against the lower mold half, and subsequently air was drawn in a direction indicated as the arrow A. With respect to this method for achieving close contact, reference numeral 16C in FIG. 3 denotes air vents for discharging air out of the mold 16.

The dimensions of the integrated circuit device according to the embodiment illustrated in FIGS. 1 and 2 were such that the device was 10 mm long and 12 mm broad, and has a radius of curvature of 1.5 mm at its four corners and a thickness of 0.65 mm. The integrated circuit device was extremely excellent in dimensional accuracy, and was small in dimensional variation that was less than $\pm 10$ $\mu$m in thickness dimension. The various thickness dimensions were generally such that each thin metal plate 11 was 0.15 mm, the adhesive 13 was 0.03 mm, the integrated circuit element 12 was 0.25 mm, and the sealing resin 15 on the integrated circuit element 12 was 0.22 mm.

Further, in the integrated circuit device according to the embodiment, as illustrated in FIG. 2, each corner section 15a of the sealing resin 15 opposite to the surfaces 11a that are the external connecting terminals was formed so as to have a curved surface whose radius of curvature was about 0.2 mm. This is to prevent the thin wall portion below the well in the plastic card from being broken by the corner sections of the integrated circuit device when the IC card is bent in case where the integrated circuit device is inserted in and is bonded to the well in the plastic card during assembly of the IC card. It was difficult in a conventional integrated circuit device using a circuit board to form each corner section so as to have a cured surface, because the process thereof was complicated. According to the embodiment however, since the sealing resin 15 is molded with the use of the mold, each corner section can be formed very easily.

Furthermore, in the integrated circuit device according to this embodiment, as shown in FIG. 2, the one surface 11a of the thin metal plates 11 serving as the external connecting terminals and the surface of the sealing resin 15 exposed to the periphery of the external connecting terminals are made substantially flush with each other. This is because, should the one side 11a be project from the sealing resin 15, the projecting portions would be liable to receive external force at carrying or during use of the IC card employing this integrated circuit device, and accordingly problems tend to occur such as separation, falling-off and so on of the thin metal plates 11. Further, when the one surface 11a is retreated from the sealing resin 15 contact defect tends to occur between the one surface 11a and the contact terminal pieces of the external device such as a reader/writer of the IC card or the like. In order to avoid this, the one surface 11a and the surface of the sealing resin 15 are made substantially flush with each other as described above.

In connection with the above, the transfer molding method using the sealing molding material whose main component is epoxy resin has been described as the molding method of the sealing resin 15. However, in addition to this, phenolic resin may be used as the sealing molding material, and molding may be effected by an injection molding method using thermoplastic resin.

Figure 4:
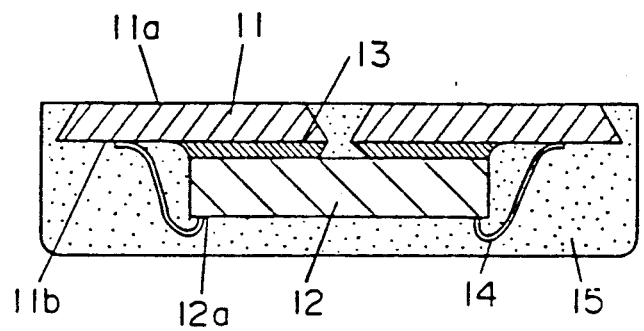
FIGS. 4 and 5 are longitudinal cross-sectional views of an integrated circuit device according to a second embodiment of the invention.
Figure 5:
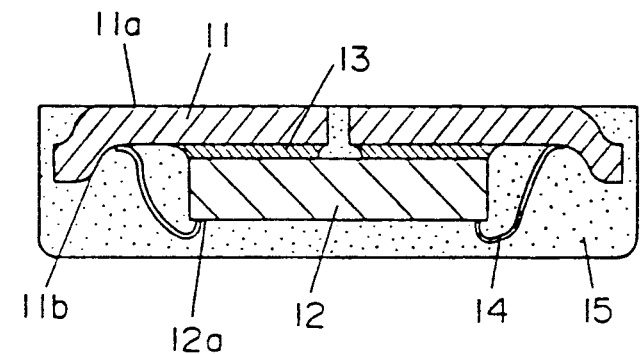

An integrated circuit device according to a second embodiment of the invention will next be described with reference to FIGS. 4 and 5. FIGS. 4 and 5 are longitudinal cross-sectional views taken along the line corresponding to the line B—B in FIG. 1. The integrated circuit device is so arranged as to be improved in the cross-sectional configuration illustrated in FIG. 2. In this connection, reference numerals in the figures identical with those in FIG. 2 designate the same or corresponding components and parts.

In FIG. 4, the area of the other surface 11b of each external connecting terminal is made larger than the area of the external connecting terminal 11a so that the cross-sectional shape of the thin metal plate 11 is substantially trapezoid. The process of forming the thin metal plate 11 substantially into a trapezoid cross-sectional shape can be conducted by contrivance due to the dimensions of a punching die and a punching wa or by control of the etching speed at both surfaces during an etching process.

In FIG. 5, a forming process is carried out for each thin metal plate 11 by pressing so that the area of the other surface 11b of the external connecting terminal 11a exposed to the sealing resin 15 is made larger than the area of the surface of the external connecting terminal 11a exposed from the sealing resin 15.

In the integrated circuit device according to the second embodiment of the invention, as shown in FIGS. 4 and 5, the area of the other surface of each thin metal plate 11 is made larger than the area of the external connecting terminal 11a. By doing so, the area of the thin metal plate 11 embedded in the sealing resin 15 is made larger than the area of the external connecting terminal 11a exposed and, therefore, it is possible to prevent the thin metal plate 11 embedded in the sealing resin 15, from being separated from the sealing resin, from projecting from the sealing resin, from being removed from the sealing resin, and so on.

Figure 6:
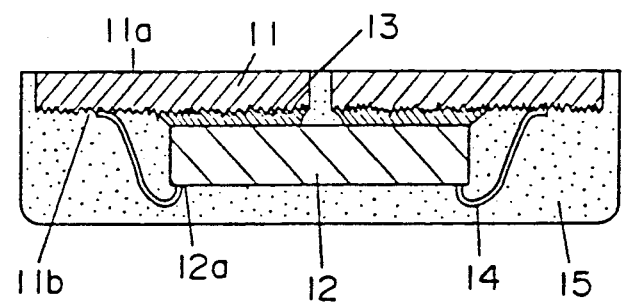
FIGS. 6 and 7 are longitudinal cross-sectional views of an integrated circuit device according to a third embodiment of the invention.
Figure 7:
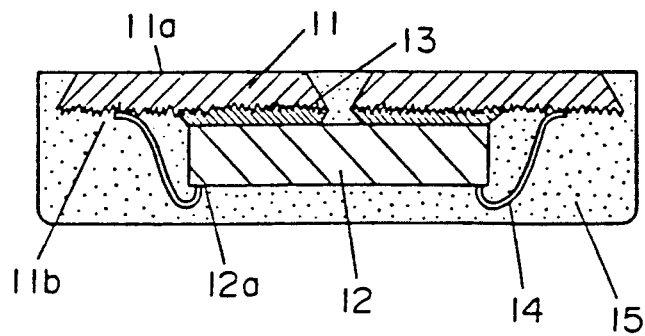

An integrated circuit device according to a third embodiment of the invention will next be described with reference to FIGS. 6 and 7. FIGS. 6 and 7 are longitudinal views taken along the line corresponding to the line B—B in FIG. 1. The integrated circuit device is improved in the surface condition of the metal thin plate illustrated in FIG. 2 or 4. In this connection, reference numerals in the figures identical with those in FIG. 2 designate the same or corresponding components and parts and, therefore, the description of the same or corresponding components and parts will be omitted.

In FIGS. 6 and 7, the surface 11b of each thin metal plate 11 embedded in the sealing resin 15 is roughened. The surface-roughening can be carried out by chemical soft etching and flush plating, physical processing such as sand blasting, or the like. By this surface roughening processing, close contact between the thin metal plates 11 and the sealing resin 15 is further improved, making it possible to prevent the thin metal plates 11 embedded in the sealing resin 15, from being separated from the sealing resin 15, from projecting from the sealing resin, from being removed from the sealing resin, and so on.

As described above, with the integrated circuit devices according to the second and third embodiments of the invention illustrated in FIGS. 4 and 5 and FIGS. 6 and 7, when these integrated circuit devices are each used as an IC card, it is possible to prevent separation, projection, removal and so on of the thin metal plates 11 from the sealing resin 15 even if pressing force is applied to the integrated circuit device due to bending or twisting of the IC card or by an external device such as a reader/writer of the IC card or the like. Thus, the arrangement is such that a function of the integrated circuit device is not liable to be damaged.

An integrated circuit device according to a fourth embodiment of the invention will next be described.

Figure 8:
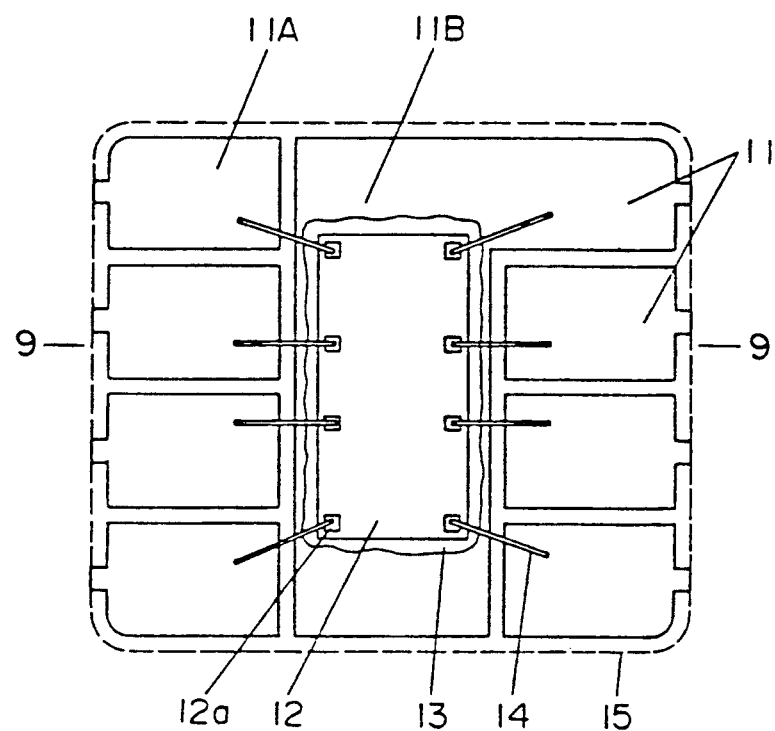
FIG. 8 is a plan view of an integrated circuit device according to a fourth embodiment of the invention.
Figure 9:
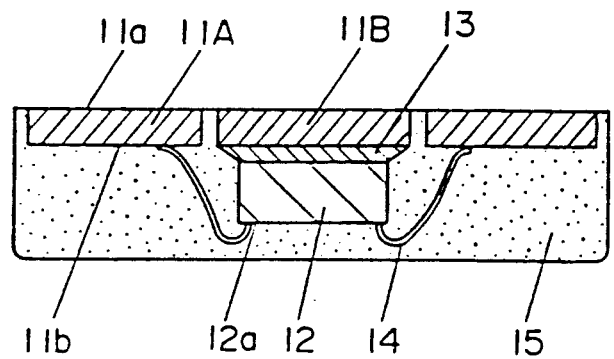
FIG. 9 is a longitudinal cross-sectional view of the integrated circuit device according to the fourth embodiment of the invention.
Figure 10:
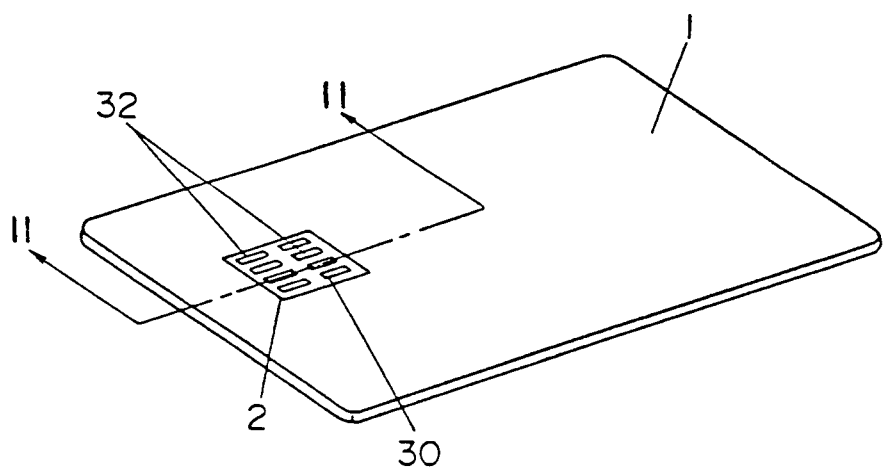
FIG. 10 is a perspective view of an IC card.
Figure 11:
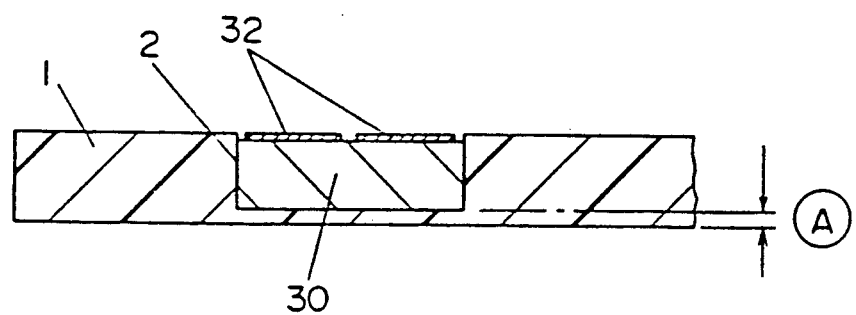
FIG. 11 is a cross-sectional view of principal portions of the IC card.
Figure 12:
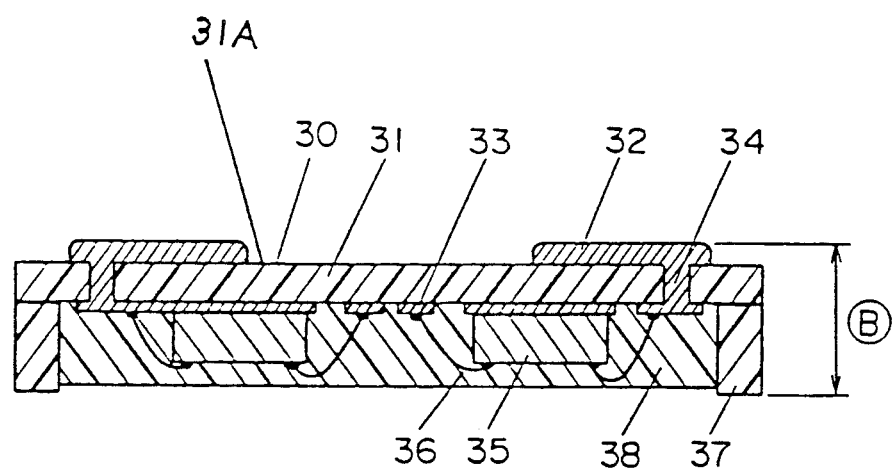
FIG. 12 is a longitudinal cross-sectional view of a conventional integrated circuit device.

FIG. 8 is a plan view of the integrated circuit device according to the fourth embodiment of the invention, and only the outer configuration of the sealing resin 15 is indicated with the broken line for explanation. FIG. 9 is a longitudinal cross-sectional view of the integrated circuit device according to the fourth embodiment of the invention, the longitudinal cross-sectional view being taken along the line C—C' in FIG. 8. In FIGS. 8 and 9, the reference numerals in the figures identical with those in FIG. 1 designate the same or corresponding components and parts, and a manufacturing method is also similar to that of the first embodiment.

The arrangement of the integrated circuit device according to this embodiment will be described below.

As shown in FIGS. 8 and 9, the integrated circuit device according this embodiment is arranged such that the plan configurations of the thin metal plates 11 are formed so as to have a plurality of external connecting terminal portions 11A and, in addition thereto, a support section 11B for packaging the integrated circuit element 12. The integrated circuit element 12 is mounted on and connected to the support section 11B through the adhesion 13. Further, in the present embodiment, as shown in FIG. 8, the support section 11B for packaging the integrated circuit element 12 is provided as an extension portion of the grounding terminal that is one of the external connecting terminal portions 11A, but this ensures flatness of the entire thin metal plates 11. In this connection, the support section 11B for packaging the integrated circuit element 12 may be provided independently from the external connecting terminal portion.

With the arrangement described above, in the integrated circuit device according to this embodiment, since the integrated circuit element 12 can be set on the single thin metal plate 11 in its entirety, the mechanical strength against bending of the integrated circuit element 12 is increased by the thin metal plate 11 and, simultaneously therewith, it is possible to prevent local stress concentration on the integrated circuit element 12. Thus, the integrated circuit device is free from destruction of the integrated circuit element 12 and the reliability thereof is extremely high.

INDUSTRIAL APPLICABILITY

As described above, the integrated circuit device according to the invention is such that it comprises the thin metal plates having one surface which at least in part is formed so as to have a plurality of external connecting terminals, and the integrated circuit element mounted on the other surface of the thin metal plates, wherein the input/output electrodes of said integrated circuit element and the other surface of said thin metal plates are electrically connected to each other, and wherein, on the other surface of the thin metal plates, at least the integrated circuit element and the electric connections between the integrated circuit element and the other surface of the thin metal plates are covered with the sealing resin. With this arrangement, it is possible to avoid using a highly accurate, precise circuit board which has conventionally been employed, and the thin metal plates of inexpensive lead frame configurations which are more widely available can be employed. Thus, the integrated circuit device can be produced at a low cost. Further, the integrated circuit device can be manufactured highly accurately in dimensions and highly efficiently as a thin-type integrated circuit device suitable for an IC card. Thus, the industrial value is high.

What is claimed is:

1. An integrated circuit card comprising an integrated circuit device packaged in a well which is formed in a first side of a plastic card and which has bottom corner parts, said integrated circuit device comprising thin metal plates arranged substantially in one and the same plane with predetermined spaces therebetween and each having a first surface and a second surface, said first surface constituting an external connecting terminal and providing a portion of an outermost boundary of said integrated circuit card at said first side of said plastic card without extending beyond a plane defined by said first side of said plastic card; an integrated circuit element bonded to at least one of said thin metal plates at said second surface by means of an adhesive and having input/output electrodes; electrical connection means for connecting said input/output electrodes to said second surface; and a sealing molding resin having a first side and second side, for covering said electrical connection means and said integrated circuit element on said first side, said sealing molding resin having corners on said second side each being rounded to provide a curved corner surface, said sealing molding resin having a shape to enable it to be closely fitted in said well in said plastic card, whereby said rounded corners prevent said plastic card from being damaged at said corner parts event said plastic card is bent or curved.

2. An integrated circuit card as set forth in claim 1, wherein said external connection terminals of said thin metal plates provide input/output electrodes for an IC card.

3. An integrated circuit card as set forth in claim 1, wherein said second surface of each of said thin metal plates has an area which is greater than that of said first surface thereof.

4. An integrated circuit card comprising an integrated circuit device packaged in a well which is formed in a first side of a plastic card and which has bottom corner parts, said integrated circuit device comprising thin metal plates arranged substantially in a plane defined by said first side of said card, said thin metal plates having predetermined spaces therebetween and each having a first surface and a second surface, said first surface constituting an external connecting terminal; and integrated circuit element bonded to at least one of said thin metal plates at said second surface by means of an adhesive and having input/output electrodes; electrical connection means for connecting said input/output electrodes to said second surface; and sealing molding resin having a first side and second side, for covering said electrical connection means and said integrated circuit element on said first side, said sealing molding resin having corners on said second side each being rounded to provide a curved corner surface, said sealing molding resin having a shape to enable it to be closely fitted in said well in said plastic card, whereby said rounded corners prevent said plastic card from being damaged at said corner parts even said plastic card is bent or curved.

* * * * *